United States Patent
Hsiao et al.

(10) Patent No.: US 7,097,463 B2
(45) Date of Patent: Aug. 29, 2006

(54) ELECTRICAL CONNECTOR

(75) Inventors: Shih-Wei Hsiao, Tu-Chen (TW); Chao-Chung Cheng, Tu-Chen (TW); Yao-Chi Huang, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/025,167

(22) Filed: Dec. 28, 2004

(65) Prior Publication Data
US 2005/0202696 A1    Sep. 15, 2005

(30) Foreign Application Priority Data
Mar. 9, 2004    (TW) .............................. 93106158 A

(51) Int. Cl.
*H01R 12/00*    (2006.01)
*H05K 1/00*    (2006.01)

(52) U.S. Cl. ......................................... 439/70; 439/140
(58) Field of Classification Search ............ 439/70–71, 439/140–141, 83
See application file for complete search history.

(56) References Cited

U.S. PATENT DOCUMENTS 3,989,331 A  * 11/1976 Hanlon ........................ 439/70
5,685,725 A  * 11/1997 Uratsuji ....................... 439/71
6,179,624 B1 *  1/2001 McHugh et al. .............. 439/71
6,443,750 B1 *  9/2002 Lemke et al. ................ 439/341

* cited by examiner

*Primary Examiner*—Javaid H. Nasri
(74) *Attorney, Agent, or Firm*—Wei Te Chung

(57) ABSTRACT

An electrical connector (1) is used for electrically connecting a ball grid array (BGA) central processing unit (CPU) (3) with a printed circuit board (PCB). The connector includes a generally rectangular insulative housing (10) and a number of terminals (20) received in the housing. Each of the terminals includes a connecting portion (200), a solder pad (202) extending from a bottom end of the connecting portion, and a cantilever (204) extending aslant from a top end of the connecting portion. The cantilever has a concave portion (206) near a free end thereof. When the CPU with a multiplicity of solder balls is attached onto the connector, the concave portions of the terminals cover bottom portions of the solder balls. Therefore, the terminals of the connector electrically connect with the solder balls of the CPU steadily, and a reliable connection between the CPU and the PCB is established.

6 Claims, 8 Drawing Sheets

ELECTRICAL CONNECTOR

BACKGROUND OF THE INVENTION

1. Field of the Invention

The present invention relates to an electrical connector for electrically connecting an electronic package such as a ball grid array (BGA) central processing unit (CPU) with a circuit substrate such as a printed circuit board (PCB).

2. Description of the Prior Art

At present, electrical connectors are widely used to electrically connect land grid array (LGA) central processing units (CPUs) with printed circuit boards (PCBs). Such an electrical connector 9 shown in FIG. 6 generally comprises an insulative housing 90 and a multiplicity of terminals 92 disposed in the housing 90. The housing 90 defines a number of passageways 901 each of which receives one of the terminals 92. Referring to FIG. 7, each of the terminals 92 includes a retaining portion 920 with several barbs to interfere with edges near the passageways 901 to secure the terminal 92 in the housing 90, a solder pad 922 extending from an upper portion of the retaining portion 920, an L-shaped connecting portion 925 extending from a lower portion of the retaining portion 920, and a contact beam 926 extending from an upper end of the connecting portion 925. A solder ball 928 is attached on the solder pad 922. An arc portion 929 is formed at a free end of the contact beam 926. The arc portion 929 forms an upper contact point (now labeled) which protrudes towards a bottom surface of an LGA CPU (not shown) with a number of metal pads.

Referring to FIG. 8, in use, the connector 9 is assembled onto a PCB 8 with the solder balls 928 of the terminals 92 contacting pads 80 of the PCB 8. The LGA CPU is attached on the connector, with the metal pads of the LGA CPU corresponding to the arc portions 929 of the terminals 92. The LGA CPU is pressed down, and the metal pads of the LGA CPU abut against the upper contact points of the arc portions 929 of the terminals 92 to deform the terminals 92. The contact beams 926 of the terminals 92 form a vertical force towards the metal pads of the LGA CPU, thereby the terminals 92 electrically contacting the metal pads of the LGA CPU. Thus, the connector 9 electrically connects the LGA CPU with the PCB 8. In above-mentioned operation, compression of the metal pads of the LGA CPU deforms the connecting portions 925 of the terminals 92, such that the upper contact points move in a horizontal direction. Because the metal pads of the LGA CPU has a length in the horizontal direction, displacements of the upper contact points of the terminals 92 are unlikely to affect electrical connections between the terminals 92 and the metal pads.

Recently, with utilization of ball grid array (BGA) CPUs, a shortcoming of the above-mentioned connector 9 appears. Referring to FIG. 8, a BGA CPU has a number of solder balls disposed on a bottom surface thereof. In an assembly of the BGA CPU 7 with a number of solder balls 70 and the connector 9, it is desired that a lower dead point of each of the solder balls 70 abuts against the upper contact point of corresponding terminal 92 of the connector 9. Therefore, the contact beam 926 of each of the terminals 92 provides a vertical force in an axial direction, and connections between the terminals 92 and the solder balls 70 are steady and reliable. However, in use, when the solder balls 70 press the arc portions 929 of the terminals 92 down, the connecting portions 925 of the terminals 92 deflect and the upper contact points of the terminals 92 move in a horizontal direction. Thus, adjacent portion of the upper contact point of each of the terminals 92 would contact a portion which is not the lower dead point of the solder balls 70, and the force provided for the solder ball 70 is not perpendicular to the bottom of the BGA CPU 7. Therefore, the connections between the solder balls 70 and the terminals 92 are unlikely to be steady and reliable.

In view of the above, a new connector that overcomes the above-mentioned disadvantages is desired.

SUMMARY OF THE INVENTION

An object of the present invention is to provide an electrical connector which has a number of terminals configured to electrically contact solder balls of a ball grid array (BGA) central processing unit (CPU) steadily and reliably.

To fulfill the above-mentioned object, an electrical connector in accordance with a preferred embodiment of the present invention is provided. The connector includes a generally rectangular insulative housing and a plurality of terminals received in the housing. The housing comprises a base member and a cover member assembled on the base member. The base member defines four recess in which upper wedges and lower wedges are formed and has four springs in four corner thereof, and the cover member forms four latches extending from a bottom thereof and catching the upper wedges or the lower wedges of the base member in assembly. Each of the terminals includes a connecting portion, a solder pad extending from a bottom end of the connecting portion, and a cantilever extending aslant from a top end of the connecting portion. The cantilever has a concave portion near a free end thereof When the CPU with a multiplicity of solder balls is attached onto the connector1 the concave portions of the terminals cover bottom portions of the solder balls. Therefore, the terminals of the connector electrically connect with the solder balls of the CPU steadily, and a reliable connection between the CPU and the PCB is established.

Other objects, advantages or novel features of the invention will become more apparent from the following detailed description when taken in adjunction with the accompanying drawings, in which:

DETAILED DESCRIPTION OF THE PREFERRED EMBODIMENT OF THE INVNETION

Reference will now be made to the drawings to describe the present invention in detail.

Figure 1:
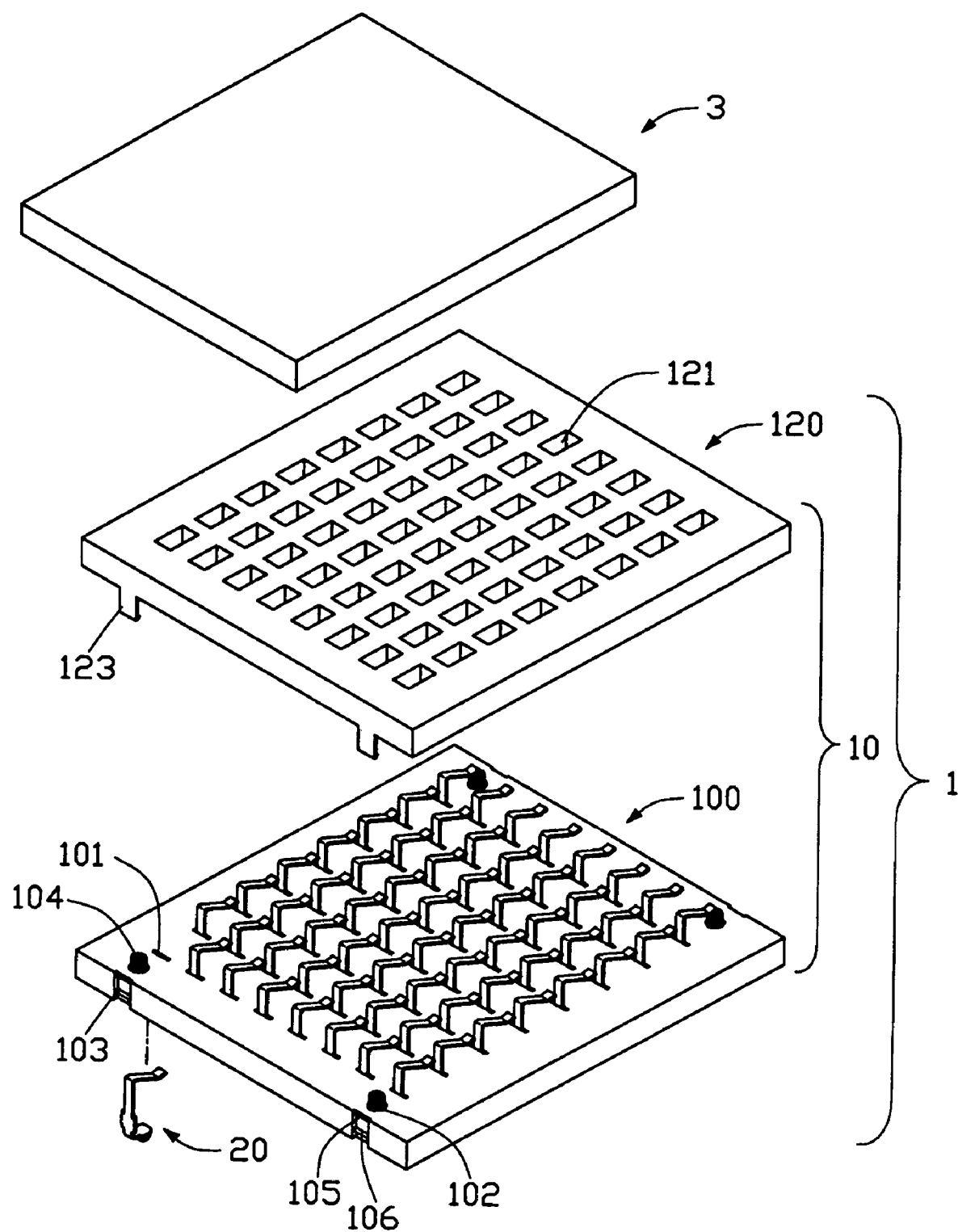
FIG. 1 is an exploded, isometric view of an electrical connector in accordance with the preferred embodiment of the present invention, together with a ball grid array (BGA) central processing unit (CPU).

Referring to FIG. 1, an electrical connector 1, which is used for electrically connecting a ball grid array (BGA) central processing unit (CPU) 3 with a printed circuit board (PCB) (not shown), is provided in the present invention. The connector 1 includes an insulative housing 10 and a number of terminals 20 disposed in the housing 10.

The housing 10 includes a base member 100 and a cover member 120 assembled onto the base member 100. The base member 100 is a generally rectangular configuration, with a number of slots 101 arranged in an array in a central portion thereof and four step holes 102 arranged in four corners thereof respectively. Each of the slots 101 extends through the base member 100 in a vertical direction thereof. A spring 104 is assembled onto the base member 100, with a lower end of the spring 104 received in one of the step hole 102. A pair of recesses 103 is defined in each of two opposite sidewalls of the base member 100, the recesses 103 corresponding to the step holes 102 respectively. An upper wedge 105 and a lower wedge 106 are formed in each of the recesses 103. The cover member 120 is also a generally rectangular configuration corresponding to the base member 100. A corresponding number of passageways 121 are defined in a central portion of the cover member 120. A pair of latches 123 is formed at each of two opposite sidewalls of the cover member 120. Each of the latches 123 extends from a bottom of the cover member 120 and forms a clasp (not labeled) at a free end thereof.

Figure 2:
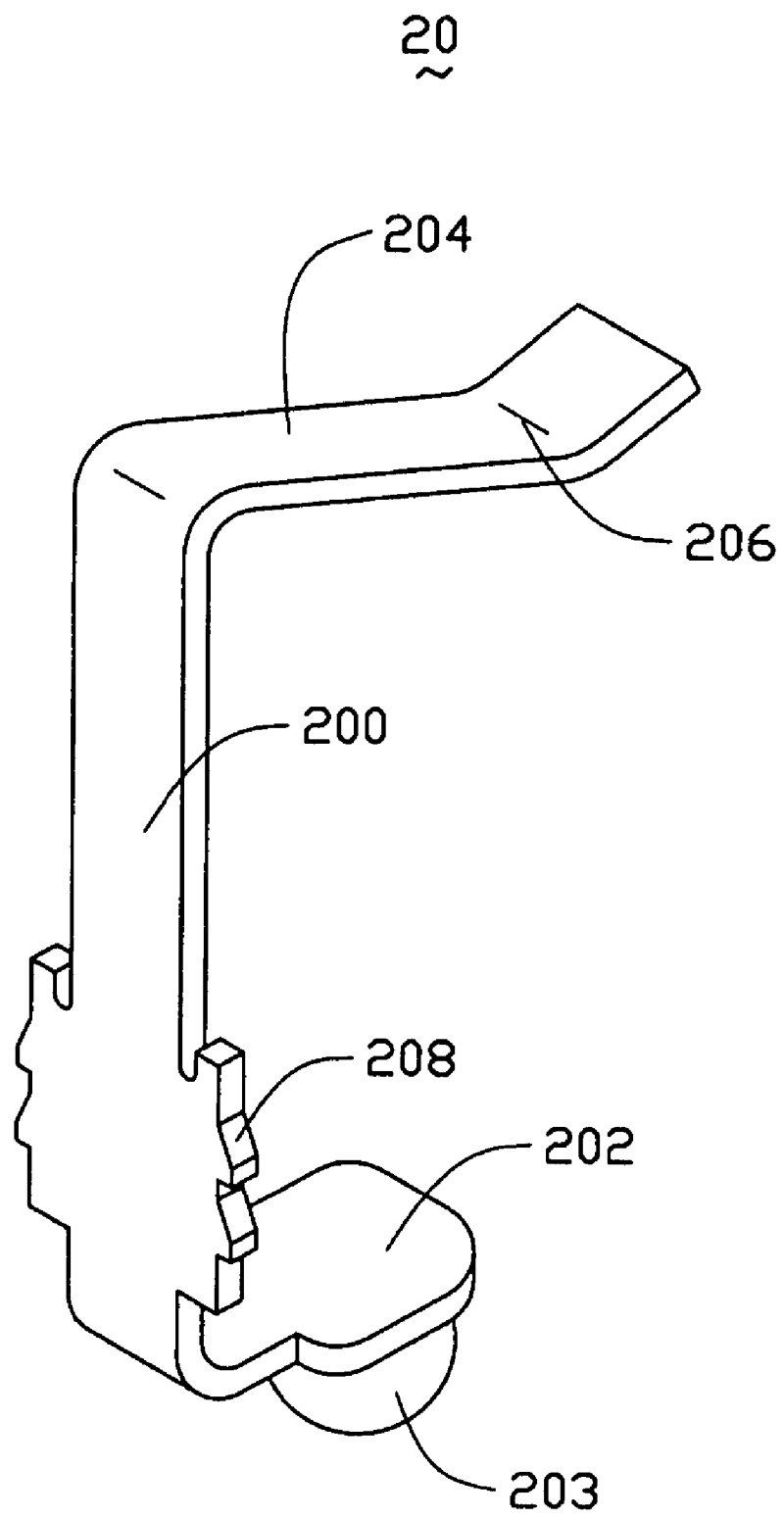
FIG. 2 is an enlarged, isometric view of a terminal of the connector in FIG. 1.

Referring to FIG. 2, each of the terminals 20 includes a connecting portion 200, a solder pad 202 extending perpendicularly from a lower end of the connecting portion 200 and a cantilever 204 slantly bending from an upper end of the connecting portion 200. A solder ball 203 is secured onto a bottom surface of the solder pad 202. The cantilever 204 is bifurcatedly defined a first end and a second end slantly extending upward toward to the BGA CPU 3 from a distal end of the first end. A concave portion 206 is formed between the first end and the second end of the cantilever 204. A pair of tabs 208 is formed at two opposite edges of a lower portion of the connecting portion 200 respectively. The tabs 208 interfere with edges near the slot 101 to secure the terminal 20 in the base member 100.

Figure 3:
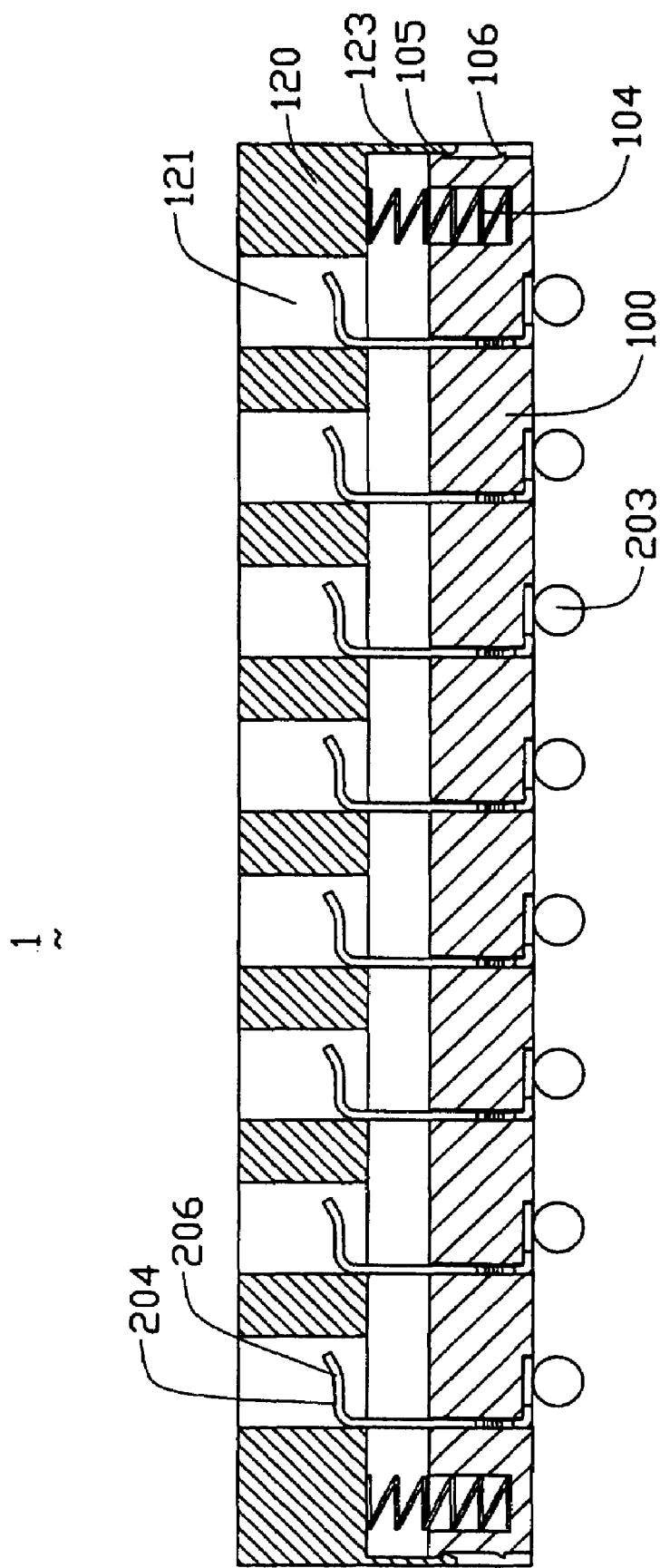
FIG. 3 is an assembled, cross-section view of the connector in FIG. 1.

Referring to FIG. 3, in assembly, the cover member 120 is disposed above the base member 100, with an upper end of the spring 104 abutting against a bottom of the cover member 120, and the clasps of the latches 123 of the cover member 120 abutting against incline surfaces of the upper wedges 105 respectively. The cover member 120 is pressed downwardly with the springs 104 compressed, and the clasps catch bottom surfaces of the upper wedges 105 respectively. Therefore, the cover member 120 is secured onto the base member 100 under the compression of the springs 104 and the actions of the clasps and the upper wedges 105. At this time, the cantilevers 204 of the terminals 20 are accommodated in lower room of the passageways 121 of the cover member 120, such that the cover member 120 can protect the terminals 20 from any damage.

Figure 4:
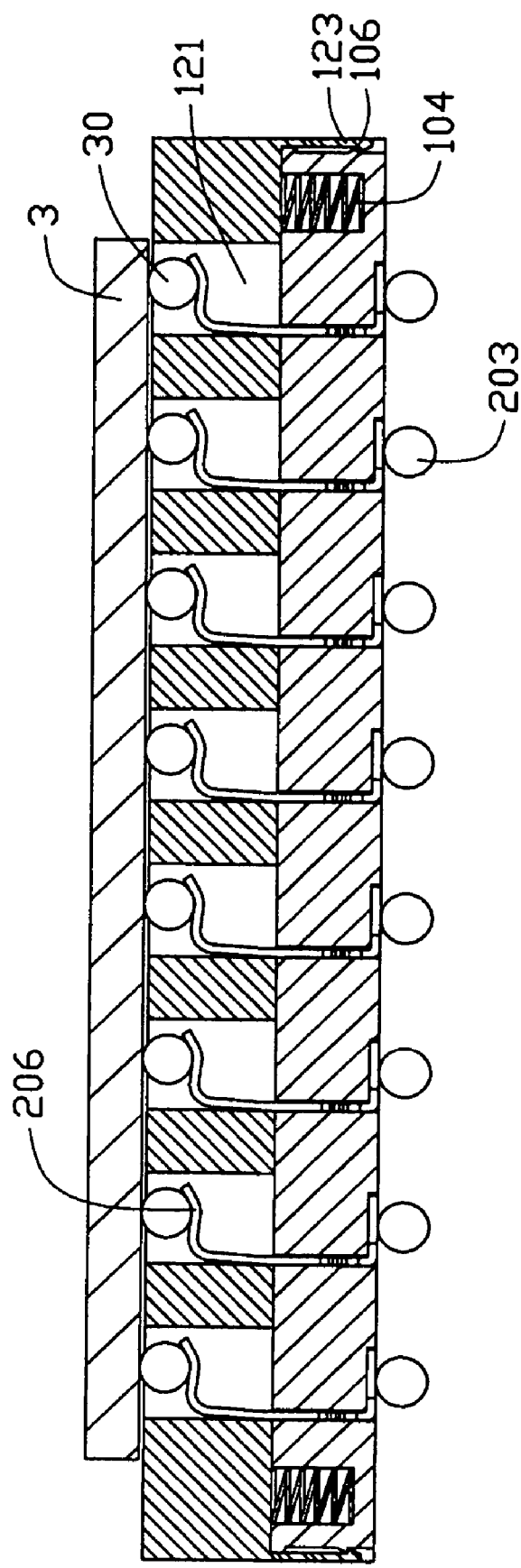
FIG. 4 is similar to FIG. 3, but showing the BGA CPU assembled onto the connector.
Figure 5:
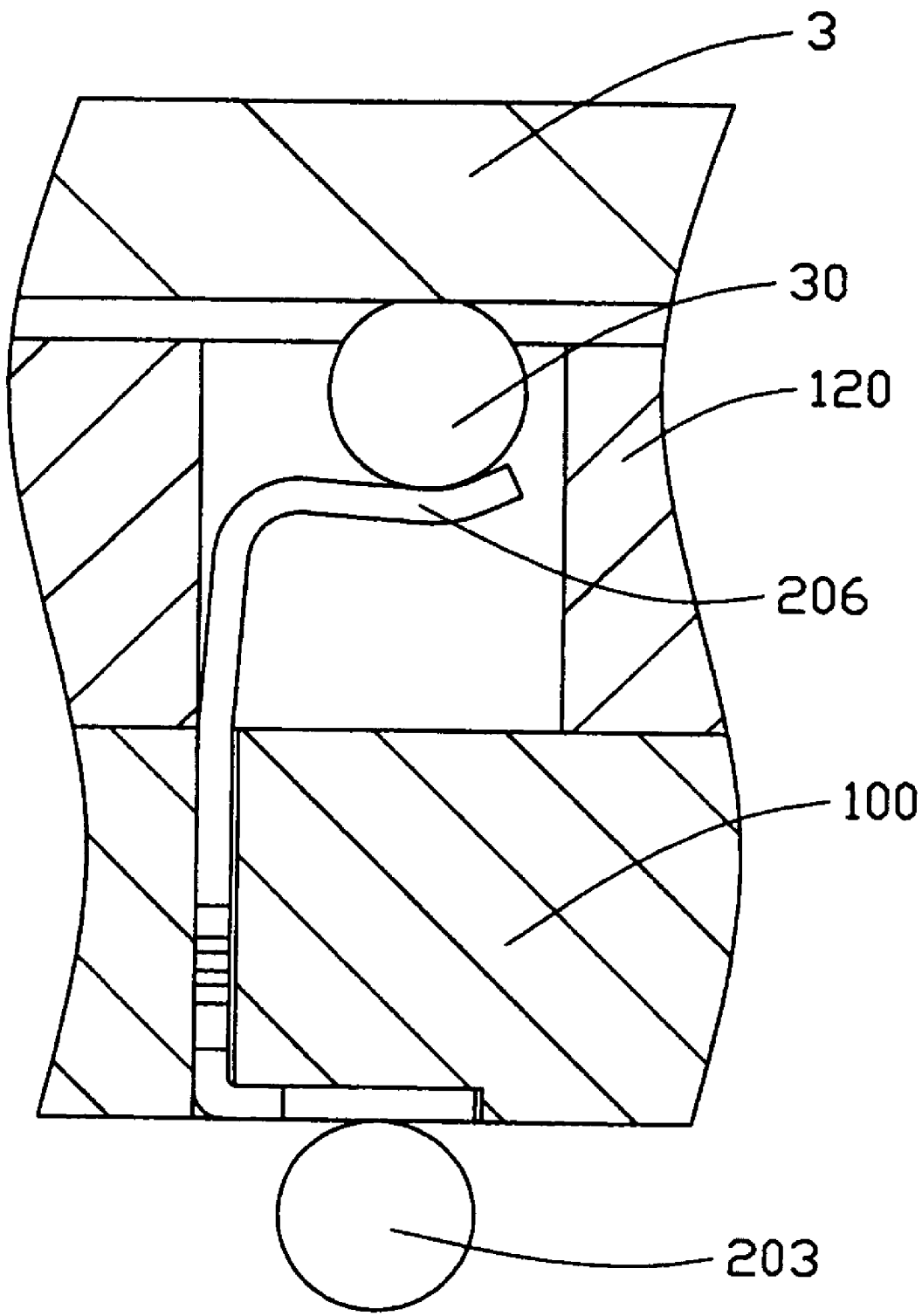
FIG. 5 is an enlarged, partial view of the FIG. 4.
Figure 6:
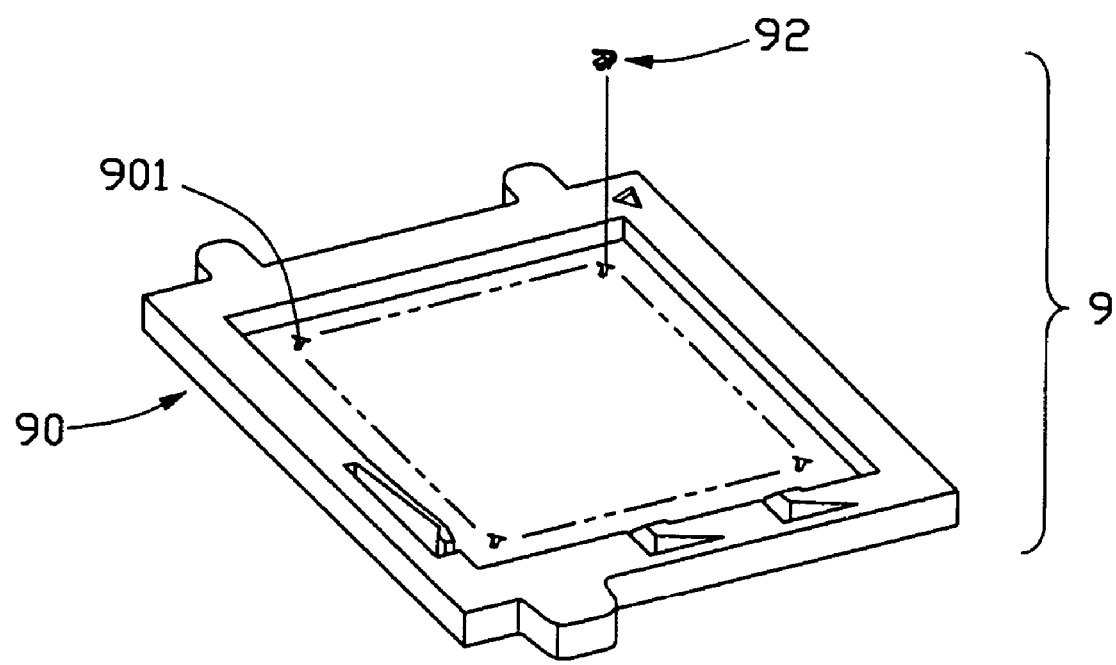
FIG. 6 is an exploded, isometric view of a conventional electrical connector.
Figure 7:
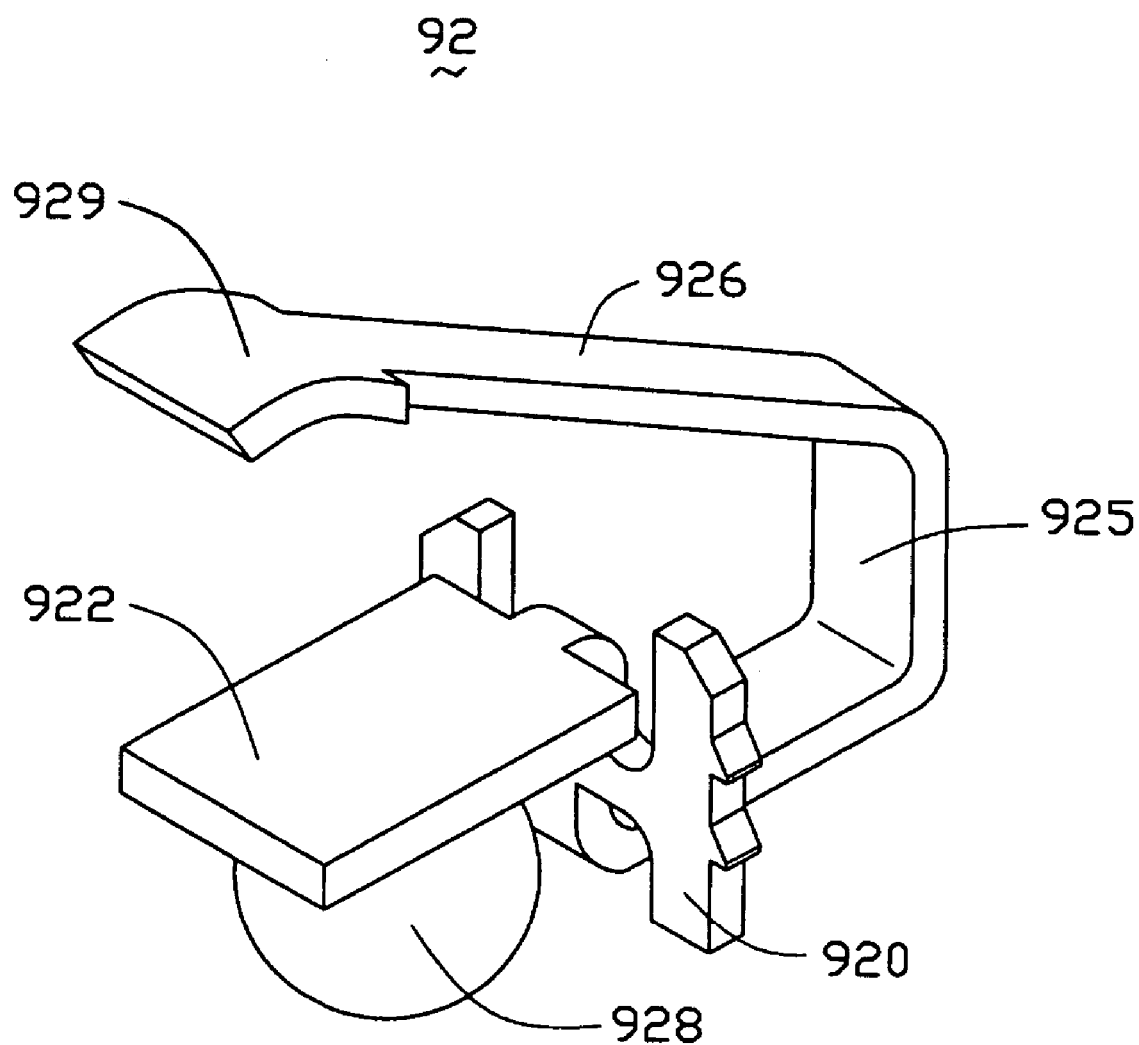
FIG. 7 is an enlarged, isometric view of a terminal of the connector in FIG. 6.
Figure 8:
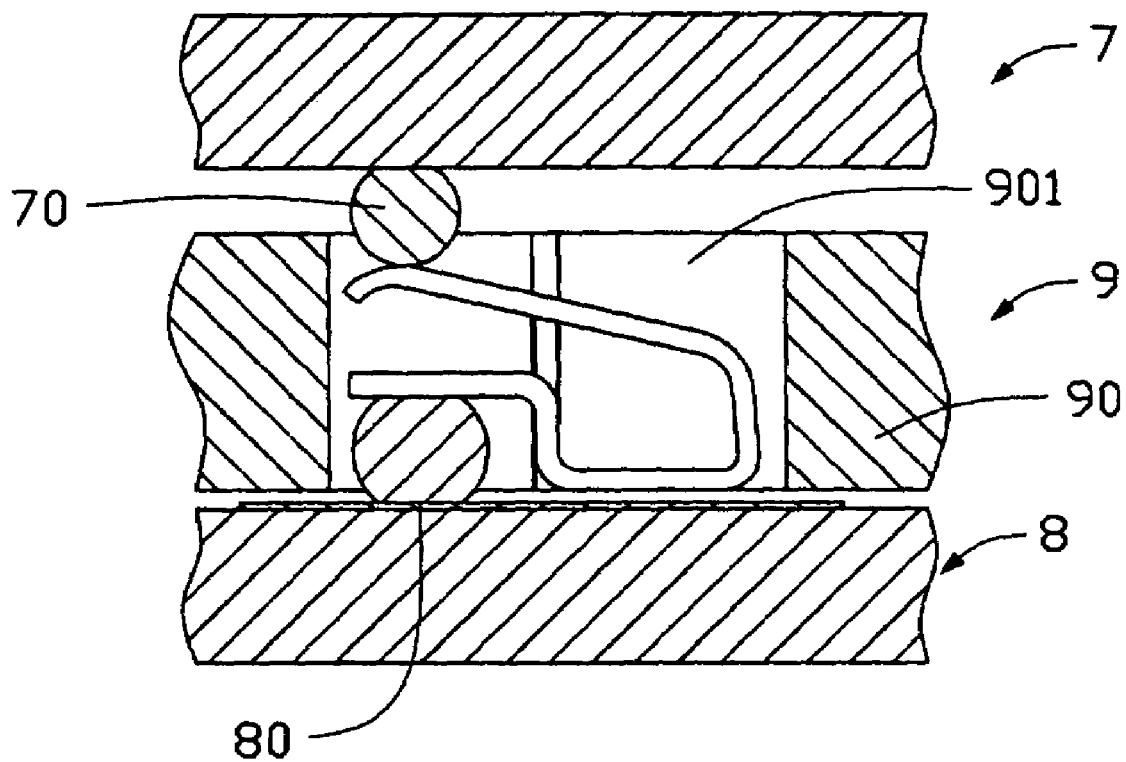
FIG. 8 is an assembled, enlarged, partial view of the connector in FIG. 6, together with a BGA CPU and a printed circuit board (PCB) assembled on the connector.

Referring to FIGS. 4 and 5, in use, firstly, the connector 1 is assembled onto the PCB with the solder balls 203 of the connector 1 connecting with pads of the PCB. Then, the cover member 120 is pressed down with the springs 104 further compressed, until the clasps catch tightly the lower wedges 106 of the base member 100 respectively. In this state, the cantilevers 204 of the terminals 20 are received in upper room of the passageways 121 respectively. The BGA CPU 3 is put onto the cover member 120. Solder balls 30 disposed onto a bottom of the BGA CPU 3 are partly received in the passageways 121 and pressed onto the concave portions 206 of the terminals 20 respectively. Compression of the solder balls 30 of the BGA CPU 3 deforms the cantilevers 204 and the connecting portions 200 of the terminals 20. Therefore, the concave portions 206 move in a horizontal direction to cover the lower portions of the solder balls 30 of the BGA CPU 3, and the cantilevers 204 form a force toward the solder balls 30 of the BGA CPU 3. In the above-mention operation, cooperation of the concave portion 206 of the terminal 20 and corresponding solder ball 30 of the BGA CPU 3 control a displacement of each of the terminals 20 in the horizontal direction. That is to say, when a lower dead point of the solder ball 30 abuts against inner lower point of the concave portion 206, the concave portion 206 of the terminal 20 stops moving in the horizontal direction. In this state, the cantilever 204 provides a force, which is in an axial direction of the solder ball 30 and perpendicular to the bottom of the BGA CPU 3. Thus, a steady and reliable electrical connection between the BGA CPU 3 and the connector 1 is established, and the connector 1 electrically connects the BGA CPU 3 with the PCB.

From the foregoing it will be recognized that the principles of the invention may be employed in various arrangements to obtain the features, advantages and benefits described above. It is to be understood, therefore, that even though numerous characteristics and advantages of the invention have been set forth together with details of the structure and function of the invention, this disclosure is to be considered illustrative only. Various changes and modifications may be made in detail, especially in matters of size, shape and arrangements of parts, without departing from the spirit and scope of the invention as defined by the appended claims.

What is claimed is:

1. An electrical connector used for electrically connecting a central processing unit (CPU) with a plurality of bumps on a bottom thereof with a printed circuit board (PCB), the connector comprising:

an insulative housing, defining a plurality of passageways extending therethrough, and comprising a base member and a cover member assembled on the base member;

a plurality of terminals disposed in the housing, each of the terminals comprising a retaining portion and a cantilever extending slantly from the retaining portion, the retaining portion engagable to mate with the housing to secure the terminal in the passageways, the cantilever forming a concave portion near a free end thereof, the concave portion protruding towards the PCB and covering lower portion of one of the bumps of the CPU when the CPU is pressed on the connector; wherein the base member defines four recess in which upper wedges and lower wedges are formed and has four springs in four corners thereof, and the cover member forms four latches extending from a bottom thereof and catching the upper wedges or the lower wedges of the base member in assembly.

2. The electrical connector as claimed in claim 1, wherein each of the terminals further comprises a solder pad extending perpendicularly from an end of the retaining portion, and a solder ball is attached on a bottom of the solder pad.

3. The electrical connector as claimed in claim 2, wherein the base member defines a plurality of slot extending therethrough, and the retaining portion of each of the terminals has several tabs to interfere with edges near the slot to secure the terminal in the base member.

4. An electrical connector assembly comprising:

an insulative housing module defining a plurality of passageways, respectively, and comprising a base member and an up-and-down moveable cover member assembled on the base member;

said base members defining four recess in which upper wedges and lower wedges being formed and having four springs in four corners thereof, and said cover member forming four latches extending from a bottom thereof and catching the upper wedges or the lower wedges of said base member in assembly;

each of said passageways defining an upward opening;

an electronic component downwardly disposed upon the housing module and including a plurality of ball-like conductor on an underside thereof and extending downwardly through the corresponding upward openings and further into the corresponding passageways, respectively;

a plurality of said terminals retained in the corresponding passageways, respectively, each of said terminals defining a single cantilevered beam with a concave structure at a free distal upper end; wherein said cantilevered beam is deflected away from a corresponding abutment wall in both lateral and downward directions due to downward movement of the corresponding ball-like conductor.

5. The assembly as claimed in claim 4, wherein a lower portion of the ball-like conductor is fully and symmetrically supported by corresponding lower portion of the concave structure.

6. The assembly as claimed in claim 5, wherein the ball-like conductor is received in the cover member, and the deflectable cantilever beam is located in the cover member.

* * * * *